United States Patent
Swanson et al.

(10) Patent No.: US 7,694,202 B2
(45) Date of Patent: *Apr. 6, 2010

(54) PROVIDING MEMORY TEST PATTERNS FOR DLL CALIBRATION

(75) Inventors: Travis E. Swanson, Ramsey, MN (US); Jeffrey J. Rooney, Blaine, MN (US)

(73) Assignee: Micron Technology, Inc., Boise, ID (US)

( * ) Notice: Subject to any disclaimer, the term of this patent is extended or adjusted under 35 U.S.C. 154(b) by 1329 days.

This patent is subject to a terminal disclaimer.

(21) Appl. No.: 10/766,611

(22) Filed: Jan. 28, 2004

(65) Prior Publication Data

US 2005/0162948 A1   Jul. 28, 2005

(51) Int. Cl.
*G01R 31/28* (2006.01)
*G06F 7/02* (2006.01)

(52) U.S. Cl. .................. 714/738; 714/739; 714/821

(58) Field of Classification Search ............ 714/718, 714/738, 815, 820, 821, 712, 728, 739; 365/200, 365/201; 711/100
See application file for complete search history.

(56) References Cited

U.S. PATENT DOCUMENTS

| | | | |
|---|---|---|---|
| 4,783,732 A | 11/1988 | Morton | |
| 5,383,143 A | 1/1995 | Crouch et al. | |
| 5,412,665 A | 5/1995 | Gruodis et al. | |
| 5,530,895 A * | 6/1996 | Enstrom | 710/9 |
| 6,035,364 A * | 3/2000 | Lambrecht et al. | 710/305 |
| 6,292,911 B1 * | 9/2001 | Swanson | 714/715 |
| 6,310,856 B1 | 10/2001 | Taipale | |
| 6,385,129 B1 | 5/2002 | Silvestri | |
| 6,401,213 B1 | 6/2002 | Jeddeloh | |
| 6,424,691 B1 | 7/2002 | Neravetla et al. | |
| 6,567,017 B2 | 5/2003 | Medlock et al. | |
| 6,970,529 B2 | 11/2005 | Cranford et al. | |
| 2002/0194557 A1 | 12/2002 | Park | |
| 2004/0136462 A1 * | 7/2004 | Chen et al. | 375/257 |
| 2005/0071399 A1 | 3/2005 | Bonaccio et al. | |
| 2005/0111536 A1 * | 5/2005 | Cranford et al. | 375/226 |
| 2005/0162948 A1 | 7/2005 | Swanson et al. | |
| 2006/0029177 A1 | 2/2006 | Cranford et al. | |

* cited by examiner

*Primary Examiner*—Phung M Chung
(74) *Attorney, Agent, or Firm*—Jones Day; Edward L. Pencoske

(57) ABSTRACT

A system and method to provide memory test patterns for the calibration of a delay locked loop (DLL) using a pseudo random bit sequence (PRBS) stored in a serial presence detect (SPD) circuit memory. The test bits stored in the SPD memory are transferred to a memory controller register (MCR) and implemented on the system data bus as test patterns that closely simulate run-time switching conditions on the system bus, so as to allow more accurate calibration of the DLL. Test data write/read operations may be performed while signals for the test patterns are present on various bit lines in the data bus so as to allow for accurate determination or adjustment of the value for the delay to be provided by the DLL to the strobe signals during memory data reading operations at run time. Memory chips may also be tested over an operating range of values using the generated test patterns.

23 Claims, 3 Drawing Sheets

PROVIDING MEMORY TEST PATTERNS FOR DLL CALIBRATION

REFERENCE TO RELATED APPLICATION

The disclosure in the present application is related to the disclosure provided in the commonly-assigned United States patent application titled "Generation of Memory Test Patterns for DLL Calibration," filed concurrently herewith.

BACKGROUND

1. Field of the Disclosure

The present disclosure generally relates to an electronic memory and, more particularly, to providing a test pattern of pseudo random bit sequence (PRBS) during calibration of a delay locked loop (DLL) and during memory testing.

2. Brief Description of Related Art

Memory devices are widely used in many electronic products and computers to store data. A memory device includes a number of memory cells, each cell storing one bit of data. The data stored in the memory cells can be read during a read operation.

One type of memory device includes a reference signal to accompany data signals during a read operation. The reference signal, commonly known as a "strobe," is used to track the output timing of the data signals read from the memory cells. In some traditional memory devices, the strobe signal is generated or turned on only during a read operation so as to enable downstream latching circuits (or flip-flops) to properly latch the data read from the memory cells. When a strobe is received in phase with the data it is latching, the strobe is preferably centered in the middle of the data so as to allow the latching circuits to more accurately time the latching operation. The centering of the strobe signal is generally done through a delay locked loop (DLL), which delays the strobe so that the latching edge of the strobe hits a flip-flop when the middle of the data window hits that flip-flop. The DLL, in turn, has to be calibrated to provide appropriate delay to the strobe signal during a data read operation. Current DLL calibration methods store very limited and generic test patterns in the memory's on-chip BIOS (basic input/output system). One such 16-bit generic test pattern is A5A5h for switching a bus to which the memory is connected during a data write/read operation. Current calibration methods switch only the whole bus with such a generic test pattern. That is, current calibration methods switch every bit line on the bus common-mode, i.e., with the same test pattern. A problem with this approach is that a high speed memory bus is rarely at a 100% usage, and the current methods of calibrating a DLL from the memory BIOS may not result in a very good representation of the bus under worst case switching conditions. Also, in the current methods, the BIOS may have limited control over the bus and over the individual bits or bytes on the bus.

As the current methods do not allow for the DLL calibration of each memory device under the worst case SSO (Simultaneous Switching Outputs) and cross-talk conditions on the bus, it is desirable to devise a method that provides memory test patterns to calibrate the DLL for each bit of each memory device for SSO, cross-talk, data routing mismatch and data loading mismatch. It is also desirable to allow a memory manufacturer to optimize the memory test patterns for each memory device so as to increase the accuracy of data read from the memory.

SUMMARY

In one embodiment, the present disclosure contemplates a method of providing a signaling pattern for a bus having a plurality of bit lines. The method comprises, for each selected bit line in the plurality of bit lines, selecting at least one of a plurality of signals to be sent over the selected bit line; and further selecting at least one of said plurality of signals to be sent over at least one bit line in the plurality of bit lines other than the selected bit line.

In another embodiment, the present disclosure contemplates a method of signaling a bus having a plurality of bit lines. The method comprises transmitting one of plurality of signals on a selected one of the plurality of bit lines; simultaneously transmitting one of said plurality of signals on one or more of the plurality of bit lines other than the selected bit line; and repeating the transmitting and simultaneously transmitting for each bit line in the plurality of bit lines.

In a further embodiment, the present disclosure contemplates a method of operating a memory connected to a bus. The method comprises transmitting one of a plurality of signals on a selected one of a plurality of bit lines in the bus; simultaneously transmitting one of said plurality of signals on one or more of the plurality of bit lines other than the selected bit line; and performing a data write/read operation at a data storage location in the memory using the bus while the signals in the transmitting and simultaneously transmitting steps are present on respective bit lines in the bus.

In a still further embodiment, the present disclosure contemplates a system comprising a plurality of memory cells to store data, a serial presence detect circuit containing a plurality of test bits, a bus having a plurality of bit lines, and a memory controller in communication with the plurality of memory cells and the serial presence detect circuit via the bus. The memory controller is configured to: store therein a plurality of test bits received from the serial presence detect circuit via the bus, transmit a first one of the plurality of test bits on a selected one of the plurality of bit lines in the bus, also transmit a second one of the plurality of test bits on one or more of the plurality of bit lines other than the selected bit line, and facilitate a data write/read operation at one of the plurality of memory cells using the bus while the first one and the second one of the plurality of test bits are present on respective bit lines in the bus.

In a still further embodiment, the present disclosure contemplates a system comprising a memory chip having a serial presence detect circuit containing a plurality of test bits, a bus having a plurality of bit lines, and a processor connected to the memory chip via the bus and in communication therewith through the bus. The processor includes a memory controller configured to store therein the plurality of test bits received from the serial presence detect circuit via the bus, to transmit a first one of the plurality of test bits on a selected one of the plurality of bit lines in the bus, and to further transmit a second one of the plurality of test bits on one or more of the plurality of bit lines other than the selected bit line.

According to the methodology of the present disclosure, memory test patterns for the calibration of a delay locked loop (DLL) are provided using a pseudo random bit sequence (PRBS) stored in a serial presence detect (SPD) circuit memory. The test bits stored in the SPD memory are transferred to a memory controller register (MCR) and implemented on the system data bus as aggressor and victim test patterns. The aggressor and victim patterns closely simulate run-time switching conditions on the system bus, so as to allow more accurate calibration of the DLL. Test data write/read operations may be performed while the aggressor and victim signals are present on various bit lines in the data bus so as to allow for accurate determination or adjustment of the value for the delay to be provided by the DLL to the strobe signals during memory data reading operations at run time. The present method introduces differential artifacts in the switching of the data bus, thereby allowing consideration of simultaneous switching outputs (SSO), cross talk, routing and loading mismatch conditions, etc., on the data bus during DLL calibration. In the present method, the data bus is represented under the worst case switching conditions, thereby allowing optimum delay calibration for the DLL. Memory chips may also be tested over an operating range of values using the generated test patterns.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state memories or memory-based systems. It is noted at the outset that the terms "connected", "connecting," "electrically connected," etc., are used interchangeably herein to generally refer to the condition of being electrically connected.

Figure 1:
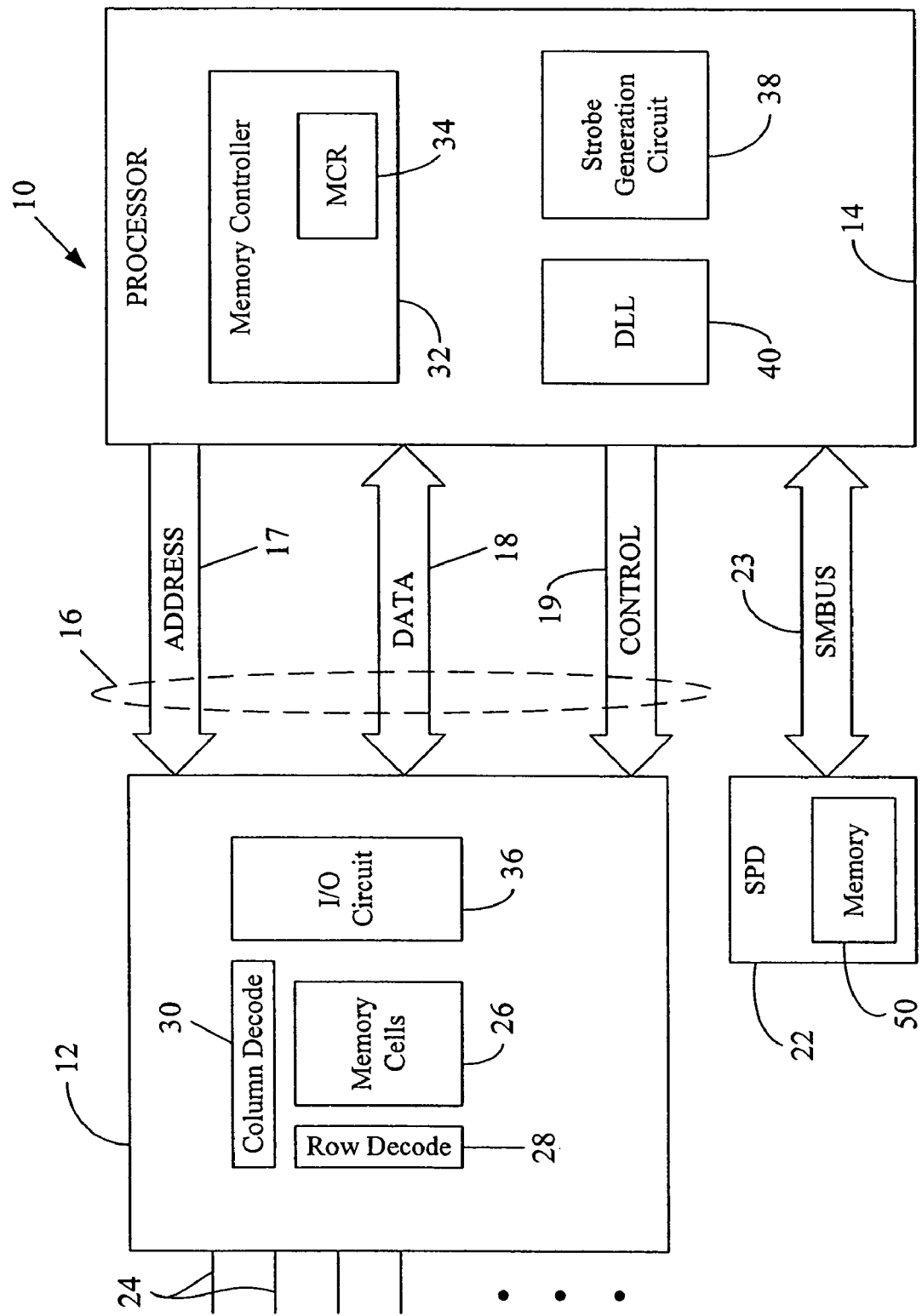
FIG. 1 is block diagram showing an exemplary system for DLL calibration including a memory chip in communication with a processor via a bus.

FIG. 1 is block diagram showing an exemplary system 10 for DLL calibration including a memory chip or memory device 12 in communication with a processor 14 via a system bus 16. FIG. 1 also shows an SPD circuit 22 (described in more detail later) in communication with the processor 14 via an SMBus (System Management Bus) 23. The processor 14 can be a microprocessor, digital signal processor, embedded processor, micro-controller, dedicated memory test chip, or the like. In one embodiment, the memory chip 12 and the SPD circuit 22 may be part of a DIMM (dual in-line memory module) or a PCB (printed circuit board) containing many such memory chips (not shown in FIG. 1). In that case, as described in more detail later, the SPD circuit 22 may store information about the whole DIMM, i.e., about all such memory chips on the DIMM.

The memory chip 12 may include a plurality of pins 24 located outside of chip 12 for electrically connecting the chip 12 to other system devices. For example, some of those pins 24 may be used to connect the chip 12 to the system bus 16, thereby allowing the processor 14 to communicate with the chip 12 and perform memory read/write operations. The processor 14 and the memory chip 12 communicate using address signals on the address lines or address bus 17, data signals on the data lines or data bus 18, and control signals (e.g., a row address select (RAS) signal, a column address select (CAS) signal, etc. (not shown)) on the control lines or control bus 19. On the other hand, the processor 14 may communicate with the SPD circuit 22 via the SMBus 23, which may have substantially smaller bandwidth than the system bus 16. In FIG. 1, the address, data and control buses 17-19 are shown to collectively form the system bus 16. Each line in the system bus 16 is referred to hereinbelow as a "bit line." Thus, for example, eight bit lines in the data bus 18 are needed to transfer a byte of data from the memory chip 12 to the processor 14, and vice versa.

Although the discussion of data read/write operations given hereinbelow is primarily described with reference to the data bus 18, it is noted here that the memory test pattern selection methodology discussed herein may be implemented on any portion of the system bus 16 (or any other signal-carrying lines connected to the memory chip 12). In other words, the methodology of the present disclosure is not confined to application just on a data-carrying bus, i.e., the data bus 18 portion of the system bus 16.

The memory chip 12 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided as part of the system 10 for writing data to and reading data from the memory cells 26. However, these peripheral devices or circuits are not shown in FIG. 1 for the sake of clarity.

The memory chip 12 may include a plurality of memory cells 26 generally arranged in rows and columns to store data in rows and columns. A row decode circuit 28 and a column decode circuit 30 may select the rows and columns in the memory cells 26 in response to decoding an address, provided on the address bus 17. Data to/from the memory cells 26 is then transferred over the data bus 18 via sense amplifiers and a data output path (not shown). A memory controller 32 may provide relevant control signals (not shown) on the control bus 19 to control data communication to and from the memory chip 12 via an I/O (input/output) circuit 36. The I/O circuit 36 may include a number of data output buffers to receive the data bits from the memory cells 26 and provide those data bits or data signals to the corresponding bit lines in the system bus 16.

The memory controller 32 may include a memory controller register (MCR) 34 (discussed later hereinbelow) and a command decode circuit (not shown) to determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates to other devices in the system 10 via the pins 24 on the chip 12. These pins, as mentioned before, may be connected to appropriate address, data and control lines in the system bus 16 to carry out data transfer (i.e., data transmission and reception) operations.

The SPD circuit 22 is a mechanism to identify a memory chip (e.g., the memory chip 12 in the single-chip embodiment of FIG. 1) to an external memory control unit (e.g., the processor 14) in a data storage system. The SPD circuit 22 minimizes the pin count needed to convey the identification information to the external control unit. The SPD circuit 22 may use a serial EEPROM (electrically erasable programmable read only memory) to store the chip's presence detection information and may require only two of the external pins (not shown) (one for enabling the SPD circuit 22 and one for transferring the appropriate detection data) to convey that information. In the embodiment shown in FIG. 1, the EEPROM is designated as a memory 50 of the SPD circuit 22. The SPD circuit 22 may communicate with the external control unit (e.g., the processor 14) via the system management bus (SMBus) 23, which may be a simple two-wire bus for low bandwidth communication. In one embodiment, the SMBus 23 may carry clock, data, and instructions between the SPD circuit 22 and the processor 14 using the I2C serial bus protocol.

The processor 14 may also include a delay locked loop (DLL) circuit 40 and a strobe generation circuit 38. The DLL circuit 40 may provide a clock signal to output a data signal, which is read from memory cells 26 during a data read operation. The strobe generation circuit 38 may provide a strobe signal that may be sent to the DLL 40 that, in turn, may introduce a delay into the strobe signal so as to synchronize the strobe signal with the data signal during the data read operation. The strobe signal is a reference signal or timing signal, which tracks the data signal when the data is output. Other circuits or devices, based on the timing of the strobe signal, can accurately capture or "latch" the data signal. The DLL 40 operates in a manner such that the data and strobe signals are synchronized with the external clock signal (not shown) when the data and strobe signals are output to other system devices. In one embodiment, the strobe generation circuit 38 may be part of the DLL circuit 40. The DLL circuit 40 may also include other conventional circuit elements (not shown in FIG. 1), such as a multi-tap delay line, a phase detector, a controller, and a model circuit. Therefore, the construction and operation of these circuit elements of DLL 40 will not be described in detail in this disclosure. It is sufficient here to state that the delay line (not shown) in the DLL 40 may include a plurality of delay cells connected in a series, in which each of the delay cells can delay a signal (e.g., the strobe signal) for a predetermined amount of time. Depending on the number of delay cells selected, the amount of delay applied to the strobe signal varies accordingly.

It is noted here that the DLL circuit 40 is shown to be a part of the processor 14, which performs the DLL calibration discussed below. However, in an alternative embodiment, the memory chip 12 may contain the DLL 40, which can be used to center an incoming strobe (e.g., a strobe from the strobe generation circuit 38) or an outgoing strobe (e.g., when the strobe generation circuit 38 is also a part of the memory chip 12 or during data write operations). In a still further embodiment, the memory chip 12 may be configured to include the memory controller 32. However, in the embodiment of FIG. 1, all such circuit elements are included in the memory test processor 14 so as to keep the design of the memory chip 12 as simple as possible.

Figure 2:
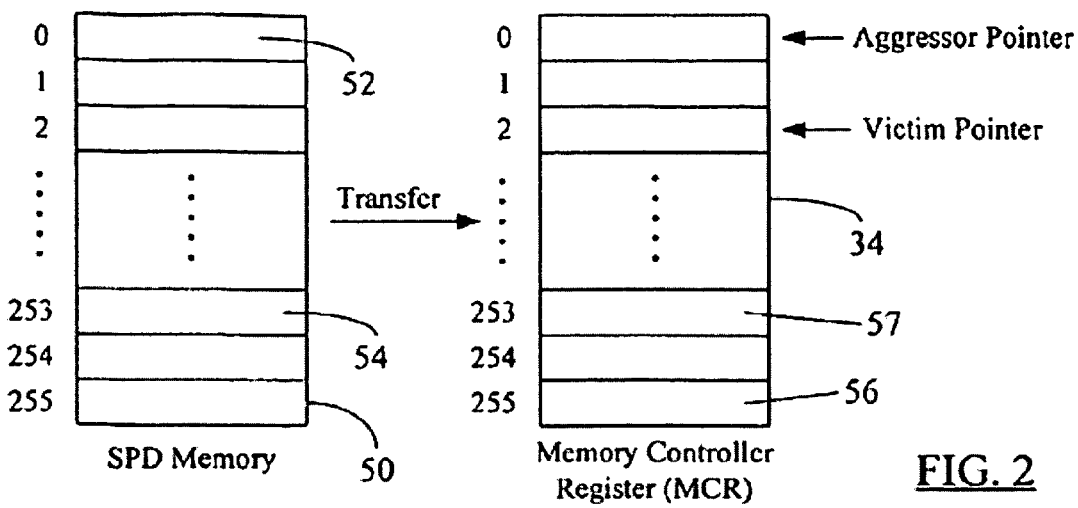
FIG. 2 illustrates how, in one embodiment of the present disclosure, a memory test pattern is transferred from an SPD circuit memory to a memory controller during DLL calibration.

FIG. 2 illustrates how, in one embodiment of the present disclosure, a memory test pattern is transferred from an SPD circuit memory 50 to the memory controller 32 during DLL calibration. In the embodiment shown in FIG. 2, because the nonvolatile memory space in the SPD memory 50 may be somewhat limited, the size of the memory test pattern may be restricted. In the embodiment of FIG. 2, the SPD memory 50 is shown to have 256 locations, each of the 256 locations storing a different bit of a 256-bit pseudo random bit sequence (PRBS), which functions as a memory test pattern as discussed below. However, it is noted here that the SPD memory 50 may have more or less than 256 locations and/or more than one bit may be stored at each SPD memory location (e.g., locations 52, 54) depending on the system configuration, size of the SPD memory 50, and the desired complexity and sophistication of test pattern generation. Thus, the length of a PRBS sequence stored in a storage location in the SPD memory 50 may range from one bit to a plurality of bits (e.g., 64 bits or 128 bits) depending on the desired complexity and sophistication of test pattern generation. Two of the storage locations in the SPD memory 50 are identified by reference numerals 52 and 54 in FIG. 2.

As part of calibrating the DLL 40, the bits in the PRBS sequence stored in the SPD memory 50 are transferred to corresponding storage locations in a memory controller register (MCR) 34 in the memory controller 32 as illustrated in FIG. 2. The MCR 34 is a data storage register that may have the same number of storage locations as those in the SPD memory 50, and each storage location in the MCR 34 may be of the same size as the corresponding storage location in the SPD memory 50 as is shown in FIG. 2. Two of the 256 storage locations in the MCR 34 are identified by reference numerals 56, 57 in FIG. 2. The memory controller 32 may implement two software pointers—an aggressor pointer and a victim pointer (discussed in more detail later hereinbelow)—to index through the PRBS sequence stored in the MCR 34.

Figure 3:
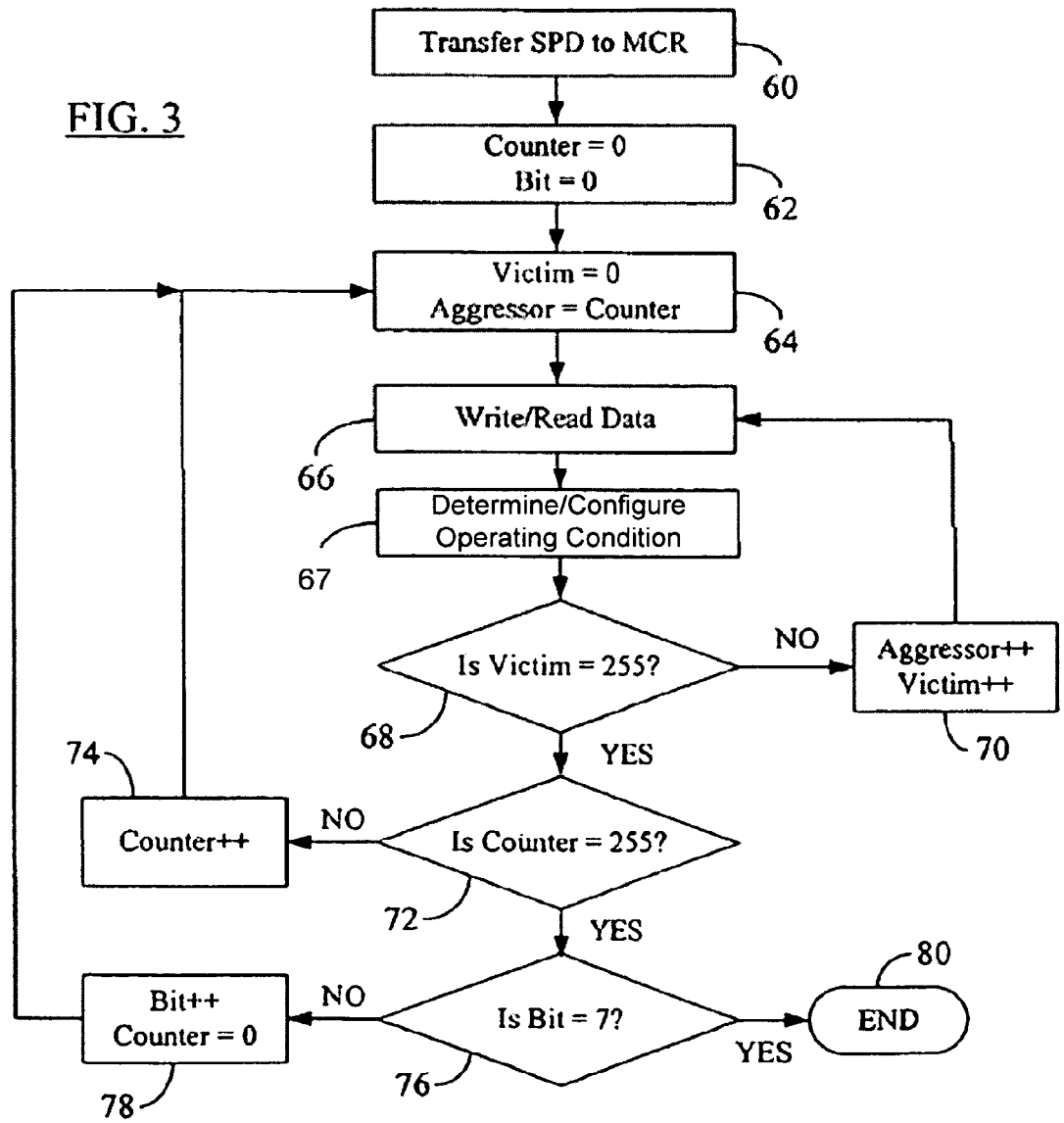
FIG. 3 is an exemplary flowchart depicting the memory test pattern generation process according to one embodiment of the present disclosure.

FIG. 3 is an exemplary flowchart depicting the memory test pattern generation process according to one embodiment of the present disclosure. The processor 14 may be pre-programmed, in hardware or software, or programmed at run time to perform the exemplary steps depicted in FIG. 3 and discussed in more detail hereinbelow. In one embodiment, the processor 14 is programmed in Verilog®. The test patterns are provided on data lines through generation of appropriate test patterns from the stored PRBS sequence. Initially, as discussed with reference to FIG. 2, the PRBS stored in the SPD memory 50 is transferred to the MCR 34 (block 60) so that the memory controller 32 can exercise the data bus 18 with appropriate test patterns during initialization or programming of the DLL 40. Thereafter, two test patterns—one is referred to herein as an "aggressor" pattern and the other is referred to as a "victim" pattern—are generated internally by the microcontroller 32 from the PRBS in the MCR 34 using corresponding software pointers (blocks 62, 64 in FIG. 3)—the aggressor pointer and the victim pointer shown in FIG. 2. The terms "aggressor" and "victim" are used herein merely to distinguish between two PRBS patterns transmitted at a time on the data bus 18. The aggressor and victim patterns are signaling patterns that are transmitted on different bit lines in the data bus 18 (as discussed below with reference to FIG. 4) to simulate extreme switching conditions on the bus so that the calibration or settings for the DLL 40 performed under these extreme switching conditions (or "test conditions") will allow for a more accurate DLL setting because of the feasibility to account for SSO, cross-talk, routing mismatch, and other worst-case switching conditions that may be present on a bus during run time. The DLL 40 calibrated under these extreme test conditions may provide an optimum delay to strobe signals during run time, thereby allowing the strobe to remain centered in the middle of the data signal (from the memory cells 26) even under extreme switching conditions during run time.

The aggressor and victim patterns may be implemented on many bits of the data bus 18 (i.e., on a portion of the data bus) or on all the bit lines in the data bus 18 (i.e., on the entire data bus). In any event, the victim pattern is implemented on a very limited or far fewer number of bits (e.g., as few as one) than the number of bits (or bit lines) carrying the aggressor pattern. For example, the victim pattern may be implemented on one bit line in the data bus 18, whereas one or more of the rest of the bit lines in the data bus 18 may implement an identical aggressor pattern on all of them. Alternatively, if it is decided to provide the test pattern for eight (8) bit lines (byte) within the data bus 18 (which can be, for example, 32-bits wide), then, in one embodiment, the victim pattern may be implemented on one of the 8 bit lines and the other seven (7) bit lines may carry the aggressor pattern. In another embodiment, the victim pattern may be implemented on two of the 8 bit lines and the other six (6) bit lines may carry the aggressor pattern. The process at blocks 62, 64, 66, 68, 70, 72, 74, 76, 78 and 80 in FIG. 3 may then be repeated for each byte in the data bus 18 until all of the 32 bit lines are exercised or signaled with the appropriate victim and aggressor test patterns.

Figure 4:
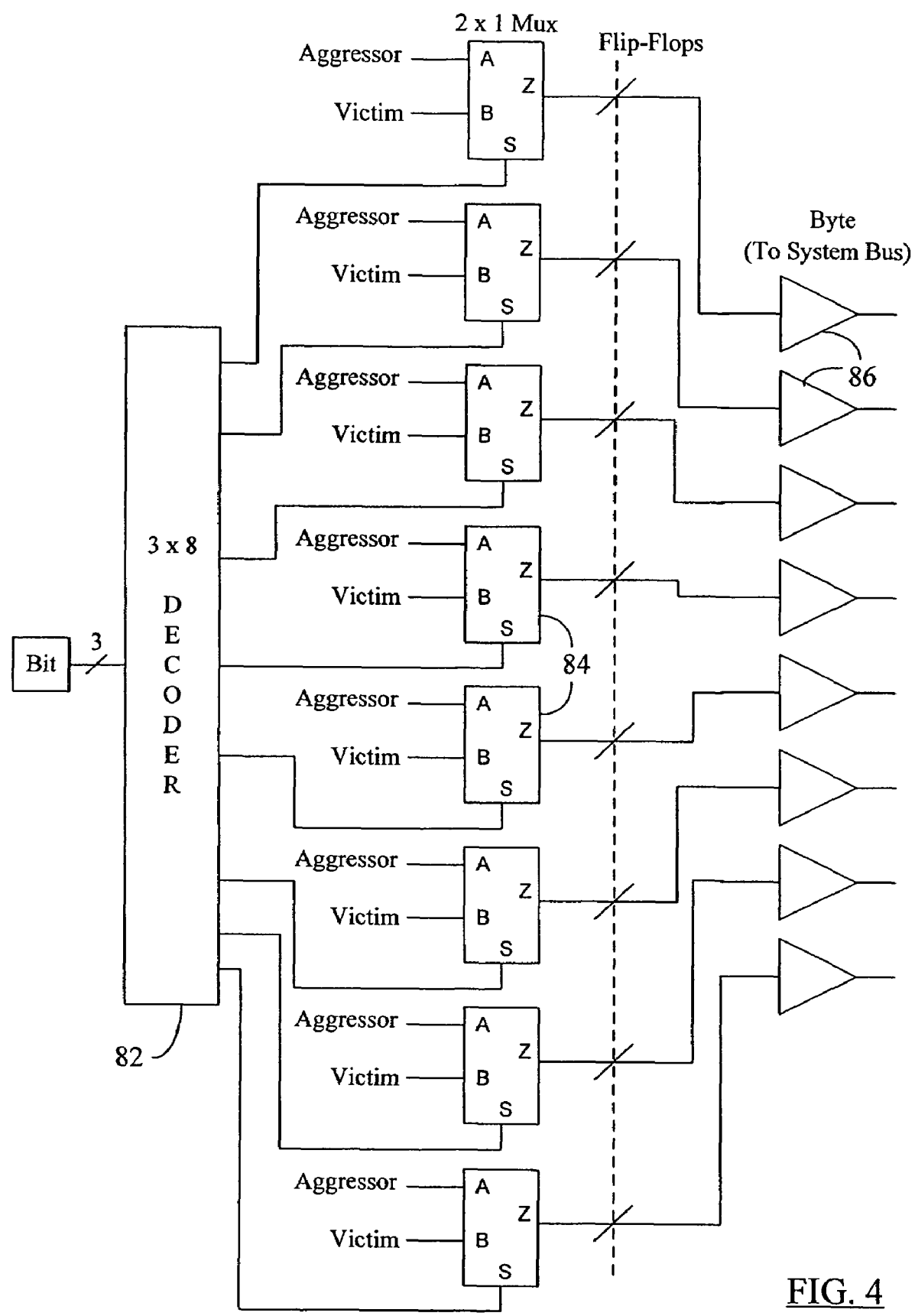
FIG. 4 shows an exemplary decode circuit that may be used to place aggressor or victim test patterns on corresponding bit lines in a byte of a system bus.

FIG. 4 shows an exemplary decode circuit that may be used to place aggressor or victim test patterns on corresponding bit lines in a byte of a system bus (here, the data bus 18 portion of the system bus 16). The circuit in FIG. 4 implements one victim pattern within a byte in the data bus 18, and the rest of the bit lines in the data bus 18 are supplied with the aggressor pattern. The circuit shown in FIG. 4 may be part of the memory controller 32 or some other portion of the processor 14 (FIG. 1). At the initiation of the DLL calibration process, the memory controller 32 may provide a beginning sequence of three bits to be decoded by a 3×8 decoder 82 to select one bit line in the data bus 18 as having a victim pattern thereon, whereas all other bit lines in the data bus 18 as having an identical aggressor pattern thereon. The operation of the circuit in FIG. 4 is straightforward. For each 3-bit sequence input, the decoder 82 allows only one of the selector (S) inputs to go high, thereby selecting one of the 2×1 multiplexer (MUX) 84 to output the victim pattern, which may be stored in an intervening flip-flop (not shown in FIG. 4) prior to being applied to a corresponding bus line via an output buffer 86. The output buffers 86 may apply the signals from the buffers to appropriate bus lines.

When one selector input of one of the eight multiplexers 84 goes high, all the remaining selector inputs will go low, thereby allowing the rest of the multiplexers 84 to transmit the aggressor pattern on the data bus lines connected to their respective output buffers 86. Thus, for each 3-bit combination at its input, the decoder 82 selects only one of eight bit lines (in the data bus 18) to keep receiving different victim bits (stored in the MCR 34 and supplied through the "Victim" input at the respective multiplexer 84) provided during the iteration of the processing loop defined by blocks 64, 68, 70, 72, and 74 in FIG. 3. While victim bits are being output on a selected bit line, the other seven bit lines in the data bus 18 simultaneously keep receiving corresponding aggressor bits (stored in the MCR 34 and supplied through the "Aggressor" inputs at respective multiplexers 84) also provided during the iteration of the processing loop defined by blocks 64, 68, 70, 72, and 74 in FIG. 3. The aggressor and victim patterns are generated by their corresponding pointers addressing appropriate storage locations whose addresses are given by the most current values in the parameters "Victim" and "Aggressor" defined at block 64 in FIG. 3 and incremented at blocks 70 and 74 during various iterations of the loops in FIG. 3. It is noted here that the two addition signs "++" adjacent to a parameter indicates an increment-by-one operation. For example, "Aggressor++" refers to incrementing the Aggressor parameter by one value.

Although the circuit in FIG. 4 shows only eight bit lines to be applied with test patterns, the circuit configuration in FIG. 4 may be repeated to simultaneously apply the test patterns to all the bit lines in the data bus 18. In that event, more than one bit line in the data bus 18 may contain the victim pattern. Alternatively, the same circuit shown in FIG. 4 may be used repeatedly to select, one after another, different bytes in the data bus 18 so as to eventually cover the entire data bus 18 for testing. In this situation, there may be only one bus line carrying the victim test pattern at a time. Further, it is noted that the PRBS in the MCR 34 remains the same whether the set of bits in the MCR 34 is treated as a victim pattern or an aggressor pattern. In other words, the same PRBS test pattern may be implemented as a victim pattern at one time and as an aggressor pattern at another time.

It is observed in the flowchart in FIG. 3 that for each bit line in the data bus 18 selected (via the decoder 82 in FIG. 4) to carry the victim test pattern, in the beginning of the first pass of the test pattern generation (block 64, 68, and 70 in FIG. 3), the victim and aggressor patterns are identical because both the aggressor and victim pointers start generating the patterns from the same MCR storage location—e.g., the storage location with address "0" in FIG. 2. Upon completion of the first pass and reaching the block 72, the victim pattern is repeated on its corresponding bit line, whereas the aggressor pattern or aggressor pointer is offset by one from the victim pattern or victim pointer as can be seen from the increment of the counter value at block 74 for the Aggressor parameter (corresponding to the Aggressor pointer) and the reset of the Victim parameter (for the Victim pointer) at block 64. After the second pass through the decision block 72, the victim pattern is again repeated on its corresponding bit line, but now the aggressor pattern is offset by two from the victim pattern. For example, in FIG. 2, the aggressor pointer is shown offset by two from the victim pointer.

The following example may illustrate the generation of aggressor and victim test patterns in case of an exemplary eight bit PRBS (instead of the 255-bit version discussed with reference to FIGS. 2 and 3) given as "11010001" and stored at locations 0-7 in the MCR 34 (which is assumed to have only eight storage locations for the present example). For the discussion here, various blocks in FIG. 3 are conceptually modified to apply to an eight-bit PRBS. Therefore, initially, the process at blocks 64, 68, and 70 will generate identical victim and aggressor test patterns of "11010001." However, upon reaching the block 72 in FIG. 3, the aggressor pointer would be offset one bit from the victim pointer, which would be reset (at block 64) to point to the location "0" in the MCR 34. Therefore, during the second pass through blocks 64, 68, and 70, the victim pattern will still be "11010001," however, the aggressor pattern will be a bit-shifted version (e.g., a left-shifted version) of the victim pattern, i.e., the aggressor pattern will be "10100011." Similarly, during the third pass through blocks 64, 68, and 70, the victim pattern will again be "11010001," however, the aggressor pattern now will be "01000111," and so on.

In short, the victim bit line continually repeats the victim pattern; whereas, upon each completion of the transmission of all 256 victim bits, the aggressor pattern is offset from the victim pattern by an additional increment (given at block 74 in FIG. 3). This process continues until the aggressor pointer is offset from the victim pointer by the same number as that of the last Victim parameter (at block 68). That is, in the case of 256-bit storage illustrated in FIG. 2, the process in FIG. 3 continues until the offset between the aggressor and victim pointers reaches "255" (i.e., the counter value=255 at block 72). The entire process at blocks 64, 66, 68, 70, 72 and 74 is then repeated, as indicated by blocks 76 and 78 and as noted hereinbefore, for each bit within a byte in the data bus 18 prior to terminating at block 80. Thus, the signaling scheme implemented through the flowchart in FIG. 3 does not switch the data bus 18 common-mode, but, instead, introduces differential artifacts (i.e., aggressor and victim signals with varying offsets therebetween) on the signals/noise present on the bit lines in the data bus 18.

To summarize the operation in FIG. 3, it is first observed that the "aggressor" and "victim" patterns are determined by how the Aggressor and Victim pointers index through the PRBS bits stored in the MCR 34. The Aggressor and Victim pointers (block 64 in FIG. 3) are initialized to the beginning of the PRBS. Both pointers are then indexed from 0 to 255, thus sending out bits stored at locations 0 to 255 in the MCR 34, thereby resulting in the same pattern for both the aggressor pattern and the victim pattern. The next sequence through, however, the Victim pointer starts at location "0" in MCR 34 and the Aggressor pointer starts at location "1." Therefore, the victim pattern contains the sequence of bits from locations 0 to 255, in that order, in the MCR 34; however, the aggressor pattern contains the sequence of bits starting from location "1" and continuing through the location "255" and then the location "0" in the MCR 34. The next time through, the victim pattern again contains bits from locations 0 to 255, but the aggressor pattern now starts with the bit at location "2" in the MCR 34 and continues through the location "255" followed by bits at locations "0" and "1", in that order. The offsetting of aggressor and victim pattern thus goes on and on. That is, the aggressor pattern continues shifting one bit relative to the victim pattern after each completion of the victim pattern. It is noted that the Victim and Aggressor pointers are interchangeable. That is, in one embodiment, the aggressor pattern may be made to repeat, whereas the victim pattern may be made to shift one bit for each pattern completion of the aggressor. Further, as noted before, more than one bit may be stored in each SPD memory location 52, 54, etc. (and, hence, in each corresponding MCR location 56, 57, etc.). In another embodiment, more than two pointers (e.g., one Victim pointer and two separate Aggressor pointers, or two separate Victim pointers and two corresponding separate Aggressor pointers, etc.) may be used for more complex test pattern generation. These pointers may then be indexed differently to manipulate different test patterns.

It is noted here that, as part of the DLL calibration process, while each pair of victim and aggressor patterns is present on the corresponding bit lines in the data bus 18, the processor 14 (FIG. 1) performs a test data write/read operation (block 66 in FIG. 3) on the memory cells 26 with the help of the memory controller 32. Based on the accuracy or integrity of the data read during various data write/read operations, the processor 14 (preferably, the memory controller 32) may adjust the value of the delay programmed in the DLL 40 (as shown in block 67 in FIG. 3) to be applied to the strobe signals from the strobe generation circuit 38. The programming of the DLL may be referred to as "DLL calibration." As is known in the art, the process of DLL calibration typically involves reading memory data relative to the memory controller 32; the data is written and then read back with a middle DLL setting for the data receiving strobe. The data read is then checked for errors against the data written. This process may be repeated with various DLL settings until an error is found at the longest/highest delay setting and at the lowest/shortest delay setting. The DLL may be then set or "calibrated" in the middle of these two settings. This process could also be applied to data writes using a DLL on the transmit/write strobe. A detailed description of how a DLL may be calibrated can be found in the U.S. Pat. No. 6,401,213 to Jeddeloh, the disclosure of which is incorporated herein by reference in its entirety.

In this manner, the DLL 40 of a source synchronous bus (e.g., the system bus 16) may be calibrated for each memory chip under the worst case switching conditions that may be present on the system bus 16 or on a portion of it (e.g., the data bus 18). It is here observed that memory manufacturers use testers to guarantee part operation. Based on these test results, certain test patterns can be derived and programmed in the static memory device (e.g., the SPD memory 50 in FIG. 1) of each memory module or DIMM. This static memory device is generally very small and can be programmed with information based on the memory chip(s) (e.g., the memory chip 12 in FIG. 1) placed on the DIMM. This information in the static memory device may be memory specific, as could be the pattern for each memory manufacturer because each manufacturer may have different test methodologies and standards. The option for the test patterns to be placed in the SPD circuit 22 allows for the patterns to be optimized by the memory/DIMM manufacturer. In one embodiment, when there is no PRBS test pattern stored in the SPD 22, then one can be generated using a liner feedback shift register (LFSR) method.

In an alternative embodiment, in addition to the calibration of a DLL, the test patterns generated according to the teachings of the present disclosure (as described with reference to FIGS. 2-4) may be used to test a memory chip (e.g., the memory chip 12 in FIG. 1). After the DLL (e.g., the DLL 40 in FIG. 1) is calibrated using the test patterns described hereinbefore, the testing of the memory chip 12 may be carried out. In testing of a memory chip, the operating conditions of the memory chip may be changed in relation to the test patterns present on the system bus 16, instead of adjusting or changing the strobe delays as in case of DLL calibration. Some examples of memory operating conditions include supply voltage(s), reference voltage(s), temperature, etc. In one embodiment, after completion of each test pattern generation, one or more memory operating conditions (e.g., a voltage and/or temperature) are changed. These changes in operating conditions are carried out over a range of values that constitutes a memory device's operating range. If the data is found corrupted during read/write operations (performed while the test patterns are present on the system bus 16 as discussed before) within this range of operating conditions, then that memory chip fails testing. On the other hand, if no failure (i.e., no data corruption) is observed during the read/write operations over these changing operating conditions, the memory chip is considered to have "passed" the testing. The memory chip testing described herein may be performed automatically with suitable hardware and software.

The foregoing describes how to provide memory test patterns for the calibration of a delay locked loop (DLL) using a pseudo random bit sequence (PRBS) stored in a serial presence detect (SPD) circuit memory. The test bits stored in the SPD memory are transferred to a memory controller register (MCR) and implemented on the system data bus as aggressor and victim test patterns. The aggressor and victim patterns closely simulate run-time switching conditions on the system bus, so as to allow more accurate calibration of the DLL. Test data write/read operations may be performed while the aggressor and victim signals are present on various bit lines in the data bus so as to allow for accurate determination or adjustment of the value for the delay to be provided by the DLL to the strobe signals during memory data reading operations at run time. Memory chips may also be tested over an operating range of values using the generated test patterns.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of providing a signaling pattern for a bus having a plurality of bit lines, said method comprising:
   storing a plurality of signals in a serial presence detect circuit;
   transferring said plurality of signals stored in said serial presence detect circuit into a memory controller; and for each selected bit line in said plurality of bit lines;
   selecting a first group of at least one of said plurality of signals comprising a set of pseudo-randomly generated bits to be sent over said selected bit line;
   further selecting a second group of at least one of said plurality of signals to be sent over at least one bit line in said plurality of bit lines other than said selected bit line, said selecting and said further selecting being performed by a memory controller from said plurality of signals transferred into said memory controller;
   transmitting said first group of signals on said selected bit line; and
   transmitting said second group of signals over said at least one bit line in said plurality of bit lines other than said selected bit line.

2. A method of signaling a bus having a plurality of bit lines, said method comprising:
   transmitting one of a plurality of signals comprised of a set of pseudo-randomly generated bits on a selected one of said plurality of bit lines;
   simultaneously transmitting one of said plurality of signals on one or more of said plurality of bit lines other than said selected bit line; and
   repeating said transmitting and simultaneously transmitting for each bit line in said plurality of bit lines, wherein said transmitting, simultaneously transmitting, and repeating are performed using a memory controller.

3. The method of claim 2, wherein each signal sent over said selected bit line is identical to each corresponding signal sent over said one or more of said plurality of bit lines other than said selected bit line.

4. A method of operating a processor connected to a memory through a bus, said method comprising:
   transmitting one of a plurality of signals comprised of a set of pseudo-randomly generated bits on a selected one of a plurality of bit lines in said bus;
   simultaneously transmitting one of said plurality of signals on one or more of said plurality of bit lines other than said selected bit line; and
   performing a data write/read operation at a data storage location in said memory using said bus while said signals in said transmitting and simultaneously transmitting are present on respective bit lines in said bus.

5. The method of claim 4 additionally comprising:
   for each selected bit line in said plurality of bit lines:
   selecting a first group of at least one of a plurality of signals comprising a set of pseudo-randomly generated bits to be sent over said selected bit line; and
   further selecting a second group of at least one of said plurality of signals to be sent over at least one bit line in said plurality of bit lines other than said selected bit line, said selecting and said further selecting being performed by a memory controller.

6. The method of claim 5, wherein said selecting is performed simultaneously with said further selecting.

7. The method of claim 5, wherein each signal sent over said selected bit line is identical to each corresponding signal sent over said at least one bit line in said plurality of bit lines other than said selected bit line.

8. The method of claim 5, wherein the number of bit lines in said plurality of bit lines is $2^N$, where $N \geq 1$.

9. The method of claim 4, wherein said performing includes:
   performing reading of data as part of said data write/read operation in conjunction with a strobe signal received from a delay locked loop.

10. The method of claim 9, further comprising:
    configuring said delay locked loop to provide a delay to said strobe signal so as to enable latching of said data during reading thereof.

11. The method of claim 10, further comprising determining a duration of said delay based on accuracy of said data read.

12. The method of claim 11, further comprising repeating said transmitting, simultaneously transmitting, performing and determining for each bit line in said plurality of bit lines.

13. The method of claim 4, further comprising:
    changing an operating condition of said memory, wherein said operating condition includes one or more of a supply voltage, a reference voltage, and temperature; and
    repeating said transmitting, simultaneously transmitting, and performing with said changed operating condition present.

14. A system comprising:
    a plurality of memory cells to store data;
    a serial presence detect circuit containing a plurality of test bits;
    a bus having a plurality of bit lines; and
    a memory controller in communication with said plurality of memory cells and said serial presence detect circuit via said bus, wherein said memory controller is configured to:
    store therein said plurality of test bits received from said serial presence detect circuit via said bus,
    transmit a first one of said plurality of test bits on a selected one of said plurality of bit lines in said bus,
    also transmit a second one of said plurality of test bits on one or more of said plurality of bit lines other than said selected bit line, and
    facilitate a data write/read operation at one of said plurality of memory cells using said bus while said first one and said second one of said plurality of test bits are present on respective bit lines in said bus.

15. The system of claim 14, wherein said memory controller is configured to transmit said first one of said plurality of test bits instead of said second one of said plurality of test bits on said one or more of said plurality of bit lines other than said selected bit line.

16. The system of claim 14, wherein said memory controller is configured to transmit said first one and said second one of said plurality of test bits simultaneously.

17. The system of claim 16, further comprising:
a delay locked loop circuit configured to provide a delayed strobe signal during reading of data as part of said data write/read operation.

18. A system comprising:
a memory chip having a serial presence detect circuit containing a plurality of test bits and a plurality of memory cells to store data;
a bus having a plurality of bit lines; and
a processor connected to said memory chip via said bus and in communication therewith through said bus, wherein said processor includes:
a memory controller configured to perform the following:
store therein said plurality of test bits received from said serial presence detect circuit via said bus,
transmit a first one of said plurality of test bits on a selected one of said plurality of bit lines in said bus, and
further transmit a second one of said plurality of test bits on one or more of said plurality of bit lines other than said selected bit line.

19. The system of claim 18, wherein said memory chip further includes:
a plurality of memory cells to store data, wherein each of said plurality of memory cells is in communication with said memory controller, and wherein said memory controller is configured to further perform the following:
enable said processor to perform a data write/read operation at one of said plurality of memory cells using said bus while said first one and said second one of said plurality of test bits are present on respective bit lines in said bus.

20. The system of claim 19, wherein said processor further includes:
a delay locked loop circuit configured to provide a delayed strobe signal during reading of data as part of said data write/read operation,
wherein said processor is configured to adjust a duration of delay for said delayed strobe signal based on accuracy of said data read during said data write/read operation.

21. The system of claim 18, wherein the number of bit lines in said plurality of bit lines is $2^N$ where $N \geq 1$.

22. The system of claim 18, wherein said memory controller is configured to further perform the following:
transmit each of said plurality of test bits in a sequence on said selected bit line; and
further transmit a shifted version of said sequence on said one or more of said plurality of bit lines other than said selected bit line, wherein the total number of test bits in said shifted version of said sequence is identical to the total number of test bits in said sequence, and wherein said shifted version of said sequence is generated by shifting the position of each test bit in said sequence by a predetermined offset.

23. The system of claim 22, wherein said predetermined offset ranges in value from one bit to the total number of test bits minus one.

* * * * *

UNITED STATES PATENT AND TRADEMARK OFFICE
CERTIFICATE OF CORRECTION

| | | |
|---|---|---|
| PATENT NO. | : 7,694,202 B2 | Page 1 of 1 |
| APPLICATION NO. | : 10/766611 | |
| DATED | : April 6, 2010 | |
| INVENTOR(S) | : Travis E. Swanson et al. | |

It is certified that error appears in the above-identified patent and that said Letters Patent is hereby corrected as shown below:

In column 7, line 15, in Claim 4, before "one" delete "on".

Signed and Sealed this

Fifteenth Day of June, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,694,202 B2 | Page 1 of 1 |
| APPLICATION NO. | : 10/766611 | |
| DATED | : April 6, 2010 | |
| INVENTOR(S) | : Travis E. Swanson et al. | |

It is certified that error appears in the above-identified patent and that said Letters Patent is hereby corrected as shown below:

In column 11, line 27, in Claim 1, delete "lines;" and insert -- lines: --, therefor.

In column 12, line 32, in Claim 11, delete "read." and insert -- read during said data write/read operation. --, therefor.

In column 13, lines 10-11, in Claim 18, delete "bits and a plurality of memory cells to store data" and insert -- bits; --, therefor.

Signed and Sealed this

Twenty-ninth Day of June, 2010

David J. Kappos
*Director of the United States Patent and Trademark Office*